(12) United States Patent
Kim et al.

(10) Patent No.: US 12,101,883 B2
(45) Date of Patent: Sep. 24, 2024

(54) ELECTRONIC DEVICE INCLUDING PRINTED CIRCUIT BOARD

(71) Applicant: SAMSUNG ELECTRONICS CO., LTD., Suwon-si (KR)

(72) Inventors: Kijung Kim, Suwon-si (KR); Jeonghoon Kim, Suwon-si (KR); Hyunseok Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 17/747,537

(22) Filed: May 18, 2022

(65) Prior Publication Data

US 2022/0418109 A1 Dec. 29, 2022

Related U.S. Application Data

(63) Continuation of application No. PCT/KR2022/006750, filed on May 11, 2022.

(30) Foreign Application Priority Data

Jun. 28, 2021 (KR) .................. 10-2021-0084313
Jul. 9, 2021 (KR) .................. 10-2021-0090188

(51) Int. Cl.
*G06F 1/16* (2006.01)
*G04G 17/08* (2006.01)
(Continued)

(52) U.S. Cl.
CPC ............ *H05K 1/147* (2013.01); *G04G 17/08* (2013.01); *G06F 1/163* (2013.01); *G06F 1/1698* (2013.01);
(Continued)

(58) Field of Classification Search
CPC ........ H05K 1/147; G06F 1/1698; G06F 1/163
(Continued)

(56) References Cited

U.S. PATENT DOCUMENTS 9,250,613 B2 2/2016 Jenwatanavet et al.
9,640,858 B1 5/2017 Islam et al.
(Continued)

FOREIGN PATENT DOCUMENTS

JP 2009-260863 11/2009
KR 10-2016-0009910 1/2016
(Continued)

OTHER PUBLICATIONS

Search Report and Written Opinion dated Sep. 1, 2022 issued in International Patent Application No. PCT/KR2022/006750.
(Continued)

*Primary Examiner* — Hung S. Bui
(74) *Attorney, Agent, or Firm* — Nixon & Vanderhye, P.C.

(57) ABSTRACT

Disclosed is an electronic device. The electronic device includes: a housing including a side wall at least partially configured as an antenna, a first printed circuit board disposed in the housing and including at least one ground part, a second printed circuit board, wherein the second printed circuit board includes an extension part extending along the side wall of the housing, a first part extending from one end of the extension part and connected to the first printed circuit board, and a second part extending from an opposite end of the extension part and electrically connected to the at least one ground part, at least one component disposed on the extension part, and a processor disposed on the first printed circuit board, and operatively connected to the at least one component through the first part of the second printed circuit board.

18 Claims, 10 Drawing Sheets

(51) Int. Cl.
*H01Q 1/24* (2006.01)
*H05K 1/14* (2006.01)

(52) U.S. Cl.
CPC ....... *H01Q 1/243* (2013.01); *H05K 2201/042* (2013.01); *H05K 2201/0999* (2013.01); *H05K 2201/10098* (2013.01); *H05K 2201/10128* (2013.01)

(58) Field of Classification Search
USPC ........................................ 361/799, 816, 818
See application file for complete search history.

(56) References Cited

U.S. PATENT DOCUMENTS

| | | | |
|---|---|---|---|
| 9,753,501 | B2 | 9/2017 | Heo et al. |
| 10,020,572 | B2 | 7/2018 | Kim et al. |
| 10,068,724 | B2 | 9/2018 | Lagorgette et al. |
| 10,116,346 | B2 | 10/2018 | Kim et al. |
| 10,136,543 | B1 | 11/2018 | Nadkarni et al. |
| 10,218,396 | B2 | 2/2019 | Son et al. |
| 10,333,211 | B2 | 6/2019 | Kim et al. |
| 10,537,039 | B2 | 1/2020 | Nadkarni et al. |
| 10,594,344 | B2 | 3/2020 | Son et al. |
| 10,620,669 | B2 | 4/2020 | Kim et al. |
| 10,727,569 | B2 | 7/2020 | Tsai et al. |
| 10,957,969 | B2 | 3/2021 | Pandya et al. |
| 11,145,958 | B2 | 10/2021 | Tsai et al. |
| 11,614,716 | B2 | 3/2023 | Liang et al. |
| 2014/0269217 | A1 | 9/2014 | Jenwatanavet et al. |
| 2016/0091921 | A1 | 3/2016 | Lee |
| 2017/0045916 | A1 | 2/2017 | Kim et al. |
| 2017/0170562 | A1* | 6/2017 | Lee ......................... H01Q 7/00 |
| 2017/0178834 | A1 | 6/2017 | Lagorgette et al. |
| 2019/0215977 | A1 | 7/2019 | Nadkarni et al. |
| 2019/0260405 | A1 | 8/2019 | Son et al. |
| 2020/0212947 | A1 | 7/2020 | Son et al. |
| 2020/0303810 | A1 | 9/2020 | Tsai et al. |
| 2021/0036434 | A1 | 2/2021 | Yeom et al. |
| 2021/0088981 | A1 | 3/2021 | Liang et al. |

FOREIGN PATENT DOCUMENTS

| | | |
|---|---|---|
| KR | 10-2017-0013682 | 2/2017 |
| KR | 10-2018-0088778 | 8/2018 |
| KR | 10-2143103 | 8/2020 |
| KR | 10-2150695 | 9/2020 |
| KR | 10-2021-0015563 | 2/2021 |
| KR | 10-2021-0046211 | 4/2021 |

OTHER PUBLICATIONS

Extended Search Report dated Aug. 21, 2024 in European Patent Application No. 22833393.6.

* cited by examiner

ELECTRONIC DEVICE INCLUDING PRINTED CIRCUIT BOARD

CROSS-REFERENCE TO RELATED APPLICATIONS

This application is a continuation of International Application No. PCT/KR2022/006750 designating the United States, filed on May 11, 2022, in the Korean Intellectual Property Receiving Office and claiming priority to Korean Patent Application No. 10-2021-0084313, filed on Jun. 28, 2021, in the Korean Intellectual Property Office and Korean Patent Application No. 10-2021-0090188, filed on Jul. 9, 2021, in the Korean Intellectual Property Office, the disclosures of all of which are incorporated by reference herein in their entireties.

BACKGROUND

Field

The disclosure relates to an electronic device including a printed circuit.

Description of Related Art

An electronic device may include an antenna for transmitting and receiving a wireless signal. The antenna may include at least a portion of the housing as an antenna element. For example, the antenna of the electronic device may include a metallic part that includes at least a portion of the housing as a radiation element.

Meanwhile, to implement various functions, the electronic device may include a plurality of electronic components at least partially exposed through the housing, for example, a key button switch, an acoustic sensor, and a biometric sensor. The electronic device may include a connection member (e.g., a flexible printed circuit board) that is disposed adjacent to the housing and operatively connects the plurality of electronic components.

Due to the plurality of electronic components that are adjacent to the housing and the flexible printed circuit board that operatively connects them, a performance of the antenna including at least a portion of the housing may deteriorate. For example, noise generated by the plurality of electronic components may influence a radiation performance of the antenna. As another example, at least a portion of the flexible printed circuit board, in which the electronic components are disposed, may be operated as an element of an antenna to generate undesired parasite components. An antenna signal may be induced in the adjacent housing to hamper the radiation performance of the antenna.

A method for using a matching element or using a ground switch may be applied to improve the problem, but there is a limit.

SUMMARY

Embodiments of the disclosure may provide a connection member that connects a plurality of components, which may reduce or prevent lowering of a performance of an antenna.

According to an example embodiment of the disclosure, an electronic device wearable by a user, is provided, the electronic device including: a housing including a side wall at least partially used as an antenna, a first printed circuit board disposed in the housing and including at least one ground part, a second printed circuit board, wherein the second printed circuit board includes an extension part extending along the side wall of the housing, a first part extending from one end of the extension part and connected to the first printed circuit board, and a second part extending from an opposite end of the extension part and electrically connected to the at least one ground part, wherein at least one component is disposed on the extension part, and a processor disposed on the first printed circuit board, and operatively connected to the at least one component through the first part of the second printed circuit board.

According to another example embodiment of the disclosure, a wearable electronic device includes: a housing including a side wall at least partially used as an antenna, a printed circuit board disposed in the housing and including at least one ground part, a connection member including at least one conductor, wherein the connection member includes an extension part extending along the side wall of the housing, a first part extending from one end of the extension part and connected to the printed circuit board, and a second part extending from an opposite end of the extension part and electrically connected to the at least one ground part, at least one component being disposed on the extension part, and at least one processor disposed on the printed circuit board and operatively connected to the at least one component through the connection member, the connection member includes a plurality of ground lines, wherein at least some of the plurality of ground lines are electrically connected to the at least one ground part of the printed circuit board through the second part.

According to various example embodiments disclosed in the disclosure, lowering of a performance of an antenna may be reduced or prevented by another configuration of an electronic device.

According to various example embodiments disclosed in the disclosure, lowering of a performance of an antenna may be reduced or prevented by electrically connecting one end of the connection member to a ground part of a printed circuit board.

According to various example embodiments disclosed in the disclosure, lowering of a performance of an antenna may be reduced or prevented by electrically connecting at least some of a plurality of ground lines of the connection member to a ground part of a printed circuit board.

According to various example embodiments disclosed in the disclosure, through the connection member that forms a loop structure, lowering of a performance of an antenna due to noise and/or parasite components due to the conventional connection member and the components disposed therein may be reduced or prevented.

In addition, the disclosure may provide various effects that are directly or indirectly recognized.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With regard to description of drawings, the same or similar components may be marked by the same or similar reference numerals.

DETAILED DESCRIPTION

Hereinafter, various example embodiments of the disclosure will be described with reference to the accompanying drawings. Accordingly, those of ordinary skill in the art will recognize that various modifications, equivalents, and/or alternatives on the various example embodiments described herein can be variously made without departing from the scope and spirit of the disclosure.

Figure 1:
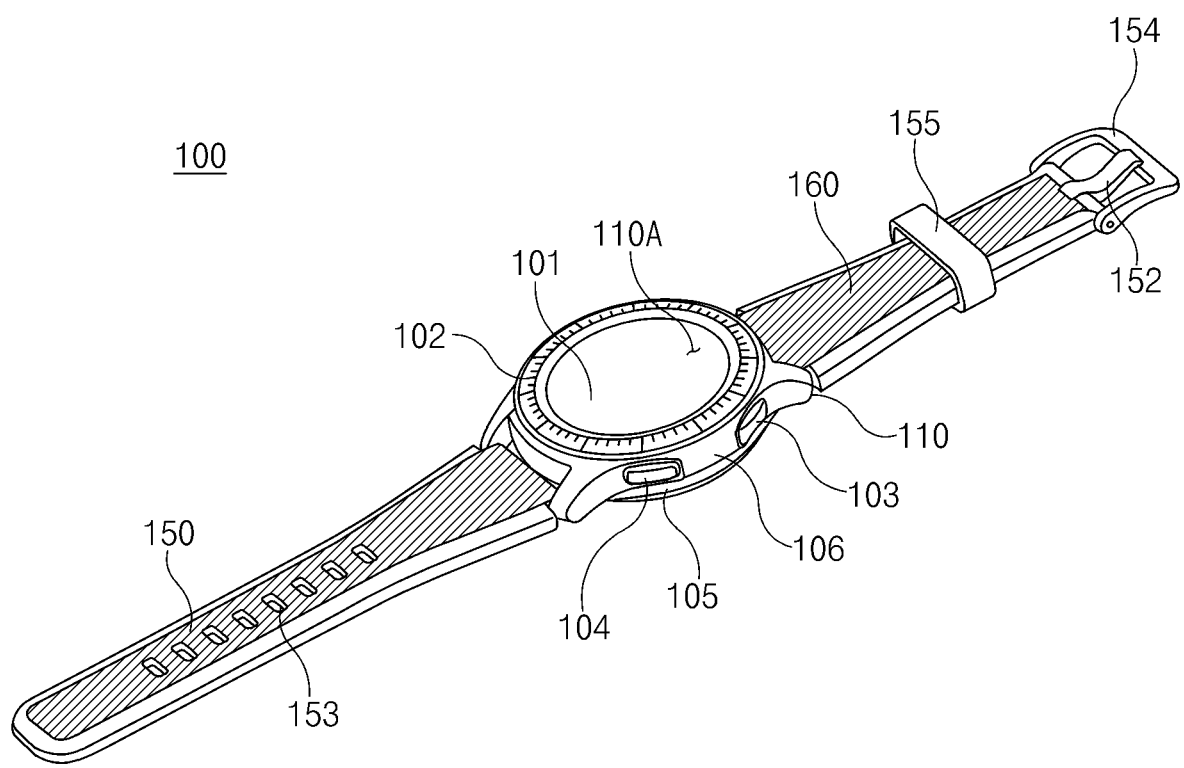
FIG. 1 is a perspective view of a front surface of a mobile electronic device according to various embodiments.

FIG. 1 is a perspective view of a front surface of a mobile electronic device according to various embodiments.

Figure 2:
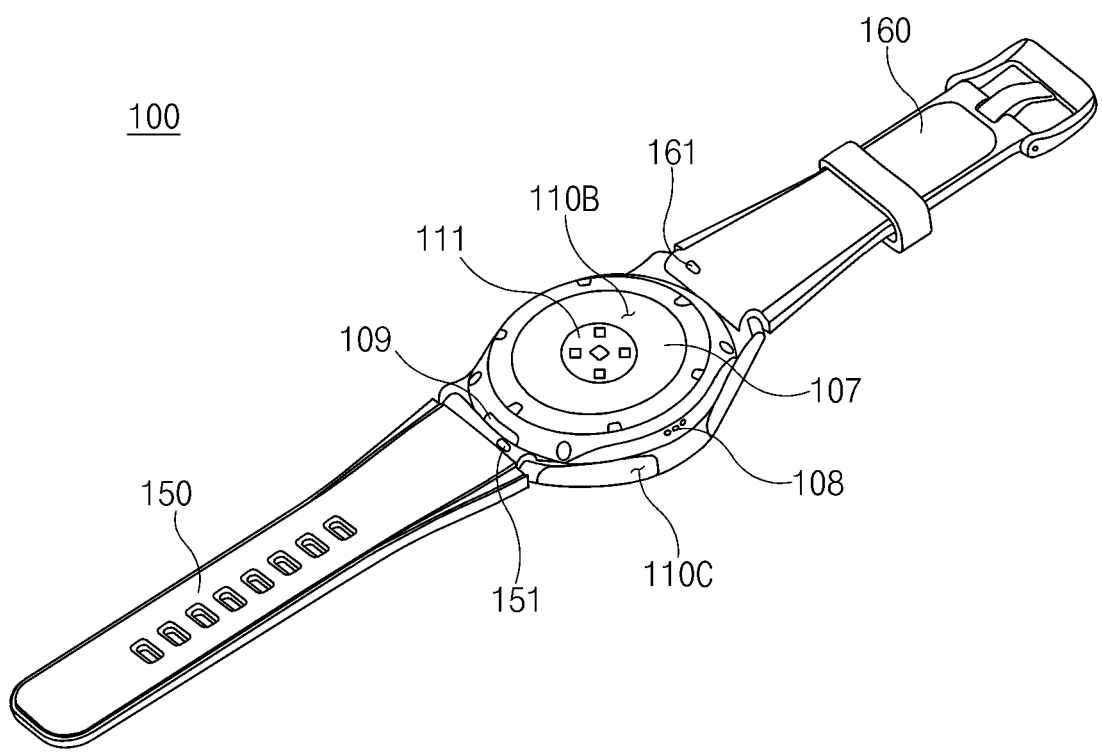
FIG. 2 is a perspective view of a rear surface of an electronic device according to various embodiments.

FIG. 2 is a perspective view of a rear surface of an electronic device according to various embodiments.

Referring to FIGS. 1 and 2, an electronic device 100 according to an embodiment may include a housing 110 including a first surface (or a front surface) 110A, a second surface (or a rear surface) 110B, and a side surface 110C surrounding a space between the first surface 110A and the second surface 110B, and fastening members (e.g. straps or bands) 150 and 160 connected to at least portions of the housing 110 and that detachably fastens the wearable electronic device 100 to a portion (e.g., a wrist or a wrinkle) of the body of a user. In an embodiment (not illustrated), the housing may refer to a structure that defines some of the first surface 110A, the second surface 110B, and the side surface 110C of FIG. 1. According to an embodiment, the first surface 110A may be defined by a front plate 101 (e.g., a glass plate or a polymer plate including various coating layers), at least a portion of which is substantially transparent. The second surface 110B may be defined by a substantially opaque rear plate 107. The rear plate 107, for example, may be formed of coated or colored glass, ceramics, a polymer, a metal (e.g., aluminum, stainless steel (STS), or magnesium), or a combination of at least two thereof. The side surface 110C may be coupled to the front plate 101 and the rear plate 107, and may be defined by a side bezel structure (or 'a side member') 106 including a metal and/or a polymer. In some embodiments, the rear plate 107 and the side bezel structure 106 may be integrally formed and may include the same material (e.g., a metallic material such as aluminum). The fastening members 150 and 160 may be formed of various material and have various shapes. A single body or a plurality of unit links that may move with respect to each other may be formed of woven fabric, leather, rubber, urethane, a metal, ceramics, or a combination of at least two thereof.

According to an embodiment, the electronic device 100 may include at least one of a display 120 (see FIG. 3), audio modules 105 and 108, a sensor module 111, key input devices 102, 103, and 104, and a connector hole 109. In some embodiments, at least one (e.g., the key input devices 102, 103, and 104, the connector hole 109, or the sensor module 111) may be omitted from the electronic device 100 or another component may be additionally included in the electronic device 100.

The display 120, for example, may be visible through a corresponding portion of the front plate 101. The shape of the display 120 may correspond to the shape of the front plate 101, and may include various shapes, such as a circular shape, an elliptical shape, or a polygonal shape. The display 120 may be coupled to or be disposed to be adjacent to a touch detection circuit, a pressure sensor that may measure an intensity (a pressure) of a touch, and/or a fingerprint sensor.

The audio modules 105 and 108 may include a microphone hole 105 and a speaker hole 108. A microphone for acquiring external sounds may be disposed in the microphone hole 105, and in some embodiments, a plurality of microphones may be disposed to detect the direction of a sound. The speaker hole 108 may be used for an external speaker and a communication receiver. In some embodiments, the speaker holes 107 and 114 and the microphone hole 105 may be implemented by one hole or a speaker may be included while the speaker hole 107 and 114 is not employed (e.g., a piezoelectric speaker).

The sensor module 111 may generate an electrical signal or a data value corresponding to an operation state of the interior of the electronic device 100 or an environmental state of the outside. The sensor module 111, for example, may include a biometric sensor module 111 (e.g., an HRM sensor) disposed on the second surface 110B of the housing 110. The electronic device 100 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor.

The key input devices 102, 103, and 104 may include a wheel key 102 disposed on the first surface 110A of the housing 110 and being rotatable in at least one direction, and/or side key buttons 102 and 103 disposed on the side surface 110C of the housing 110. The wheel key may have a shape corresponding to the shape of the front plate 101. In an embodiment, the electronic device 100 may not include some or all of the above-mentioned key input devises 102, 103, and 104, and the key input devices 102, 103, and 104 which are not included, may be realized in different forms, such as a soft key, on the display 120. The connector hole 109 may accommodate a connector (e.g., a USB connector) for transmitting and receiving power and/or data to and from an external electronic device, and may include another connector hole (not illustrated) that may accommodate a connector for transmitting and receiving an audio signal to and from an external electronic device. The electronic device 100, for example, may further include a connector cover (not illustrated) that covers at least a portion of the connector hole 109 to interrupt introduction of external foreign substances through the connector hole 109.

The fastening members 150 and 160 may be detachably fastened to at least a partial area of the housing 110 using locking members 151 and 161. The fastening members 150 and 160 may include one or more of a fixing member 152, a fixing member coupling hole 153, a band guide member 154, and a band fixing ring 155.

The fixing member 152 may be configured to fix the housing 110 and the fastening members 150 and 160 to a portion (e.g., a wrist or a wrinkle) of the body of the user. The fixing member coupling hole 153 may fix the housing 110 and the fastening members 150 and 160 to a portion of the body of the user in correspondence to the fixing member 152. The band guide member 154 may be configured to restrict a motion range of the fixing member 152 when the fixing member 152 is coupled to the fixing member coupling hole 153 so that the fastening members 150 and 160 are fastened to be attached to a portion of the body of the user. The band fixing ring 155 may restrict motion ranges of the fastening members 150 and 160 in a state in which the fixing member 152 and the fixing member coupling hole 153 are coupled to each other.

Figure 3:
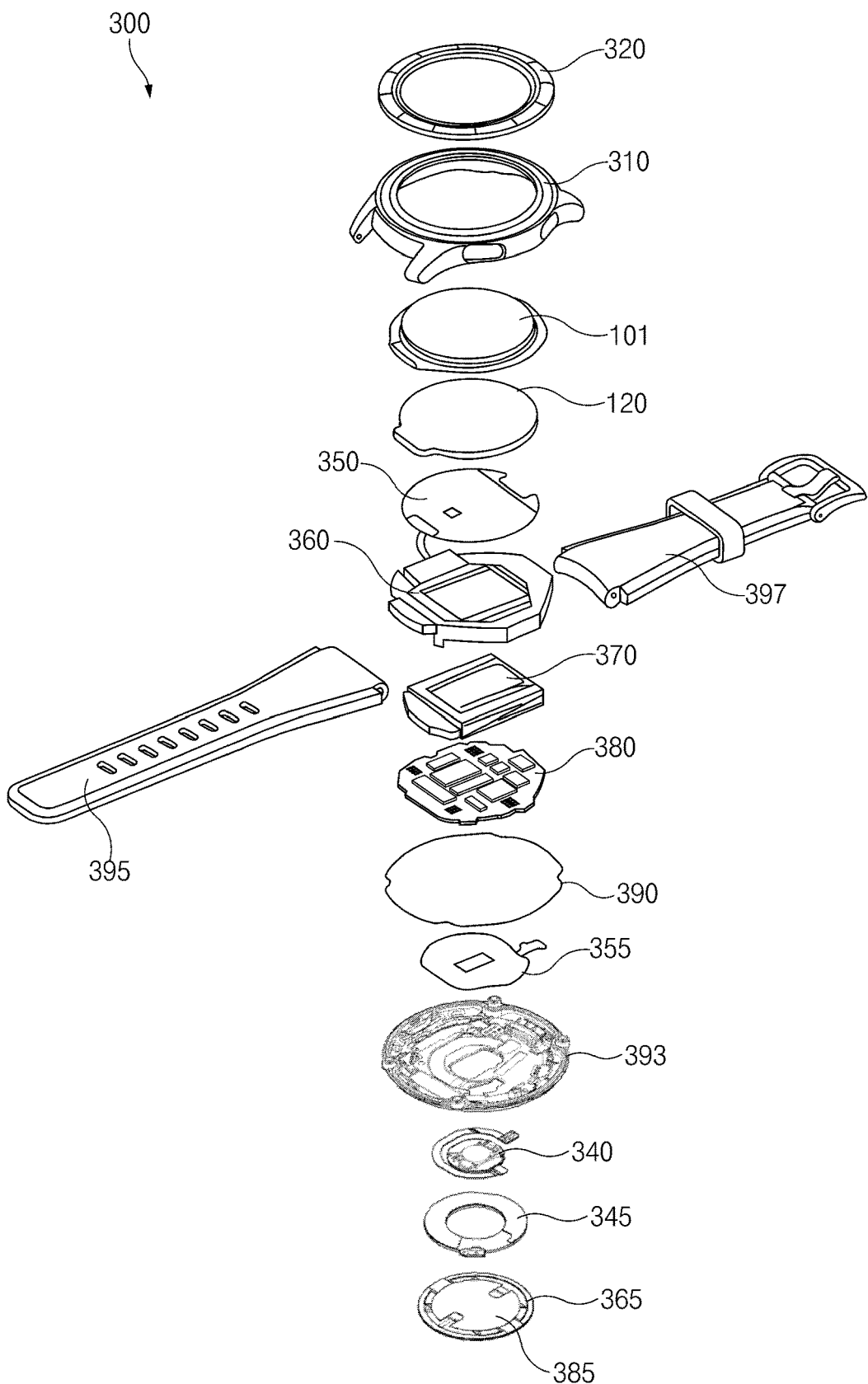
FIG. 3 is an exploded perspective view of an electronic device according to various embodiments.

FIG. 3 is an exploded perspective view of an electronic device according to various embodiments.

Referring to FIG. 3, an electronic device 300 (e.g., the electronic device 100 of FIG. 1) may include a side bezel structure 310, a wheel key 320, a front plate 101, a display 120, a first antenna 350, a second antenna 355, a support member 360 (e.g., a bracket), a battery 370, a printed circuit board 380, a sealing member 390, a rear plate 393, fastening members (e.g., bands or straps) 395 and 397, a wireless charging coil 345, a sensor module (e.g., including at least one sensor) 340, a cover 365, and an optical film 385. At least one of the components of the electronic device 300 may be the same as or similar to at least one of the components of the electronic device 100 of FIGS. 1 and 2, and a repeated description thereof may not be provided. The support member 360 may be disposed in the interior of the electronic device 300 to be connected to the side bezel structure 310 or to be integrally formed with the side bezel structure 310. The support member 360, for example, may be formed of a metallic material and/or a nonmetallic material (e.g., a polymer). The display 120 may be coupled to one surface of the support member 360, and the printed circuit board 380 may be coupled to an opposite surface of the support member 360. A processor, a memory, and/or an interface may be mounted on the printed circuit board 380. The processor, for example, may include one or more of a central processing unit, an application processor, a graphic processing unit (GPU), an application processor, a sensor processor, or a communication processor.

The memory, for example, may include a volatile and/or nonvolatile memory. The interface, for example, may include a high definition multimedia interface (HDMI), a universal serial bus (USB), an SD card interface, and/or an audio interface. The interface, for example, may electrically or physically connect the electronic device 300 to an external electronic device, and may include a USB connector, an SD card/MMC connector, and an audio connector.

The battery 370 is a device for supplying electric power to at least one component of the electronic device 300, and for example, may include a secondary battery that may be recharged. At least a portion of the battery 370, for example, may be disposed on substantially the same plane as the printed circuit board 380. The battery 370 may be integrally disposed in the interior of the electronic device 100, and may be disposed to be detachable from the electronic device 100.

The first antenna 350 may be disposed between the display 120 and the support member 360. The first antenna 350, for example, may include a near field communication (NFC) antenna, a wireless charging antenna, and/or a magnetic secure transmission (MST) antenna. The first antenna 350, for example, may perform short-range communication with an external device, may wirelessly transmit and receive electric power that is necessary for charging, and may transmit a short range communication signal or a magnetism-based signal including payment data. In an embodiment, an antenna structure may be formed by one or a combination of the side bezel structure 310 and/or the support member 360.

The second antenna 355 may be disposed between the circuit board 380 and the rear plate 393. The second antenna 355, for example, may include a near field communication (NFC) antenna, a wireless charging antenna, and/or a magnetic secure transmission (MST) antenna. The second antenna 355, for example, may perform short-range communication with an external device, may wirelessly transmit and receive electric power that is necessary for charging, and may transmit a short range communication signal or a magnetism-based signal including payment data. In an embodiment, an antenna structure may be formed by one or a combination of the side bezel structure 310 and/or the rear plate 393.

The sealing member (e.g., seal) 390 may be located between the side bezel structure 310 and the rear plate 393. The sealing member 390 may be configured to interrupt moisture and foreign substances that are introduced into a space surrounded by the side bezel structure 310 and the rear plate 393 from the outside.

In an embodiment, the wireless charging coil 345 may be disposed on one surface of the rear plate 393. For example, the wireless charging coil 345 may be disposed between the rear plate 393 and the cover 365. In an embodiment, the wireless charging coil 345 may be configured to transmit and receive an electric power signal from an external device.

In an embodiment, the sensor module 340, for example, may be disposed between the rear plate 393 and the cover 365. In an embodiment, the sensor module 340 may at least partially face the cover 365. For example, the sensor module 340 may be disposed to be at least partially accommodated in a hollow formed in the wireless charging coil 345, and thus may face the cover 365. The sensor module 340, for example, a substrate part, and a sensor part disposed in the substrate part and that acquires biometric information. The sensor part may be disposed to face the cover 365 that at least partially contacts a wrist of the user in a state, in which the user wears the electronic device 300. In an embodiment, the sensor unit of the sensor module 340, for example, may include an optical sensor including a light emitting part and a light receiving part for measuring a heart rate of the user. In this case, the cover 365 may be formed of a material (e.g., a substantially transparent resin) that may at least partially transmit light. To improve optical characteristics of the sensor module 340, an optical film 385 may be disposed between the cover 365 and the sensor module 340. In an embodiment, the cover 365 may include an electrode (not illustrated) for detecting biometric information (a bioelectrical impedance analysis (BIA) sensor signal and/or an electrocardiogram (ECG) sensor signal).

Figure 4:
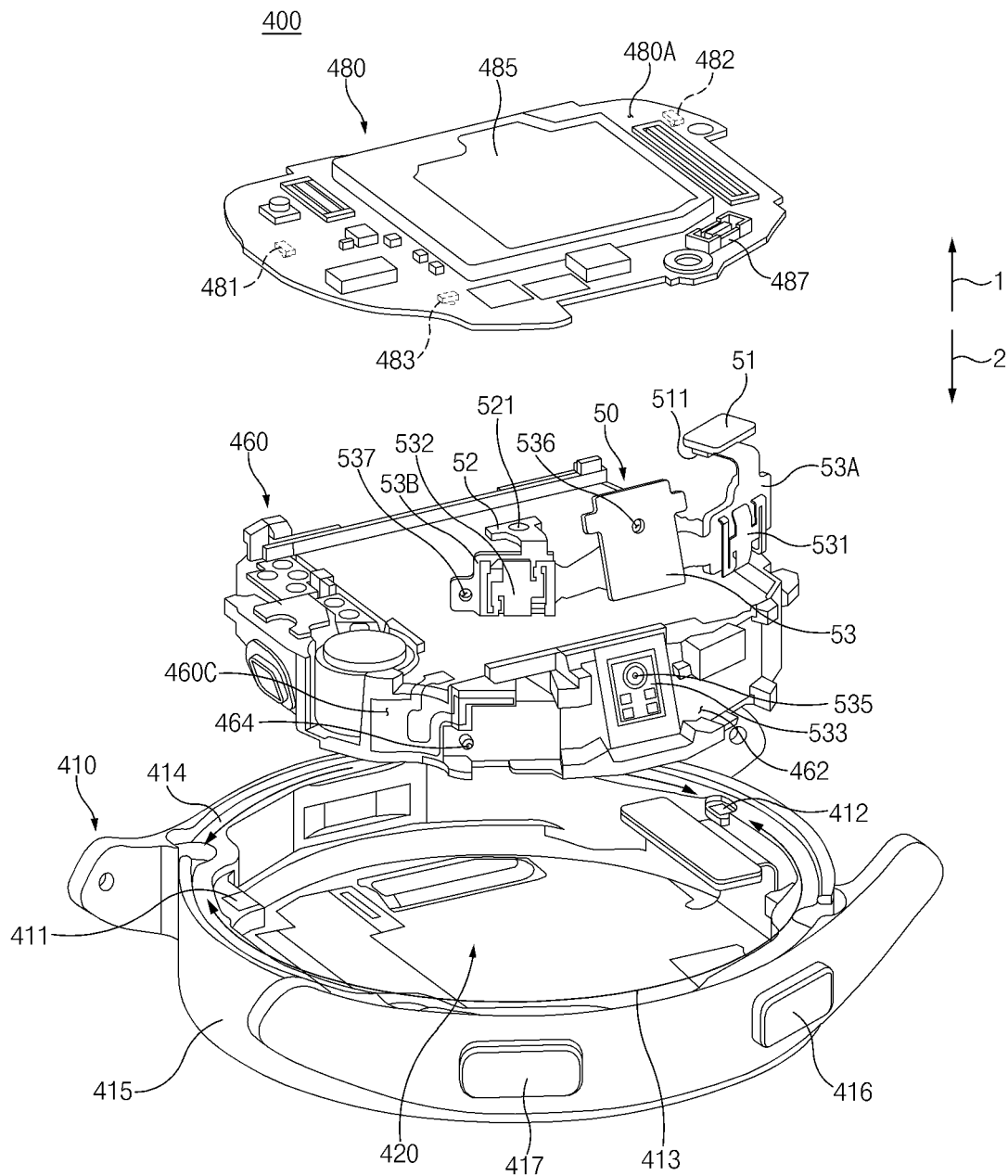
FIG. 4 is a perspective view illustrating example configurations of an electronic device according to various embodiments.

FIG. 4 is a perspective view illustrating various example configurations of an electronic device according to various embodiments.

Figure 5:
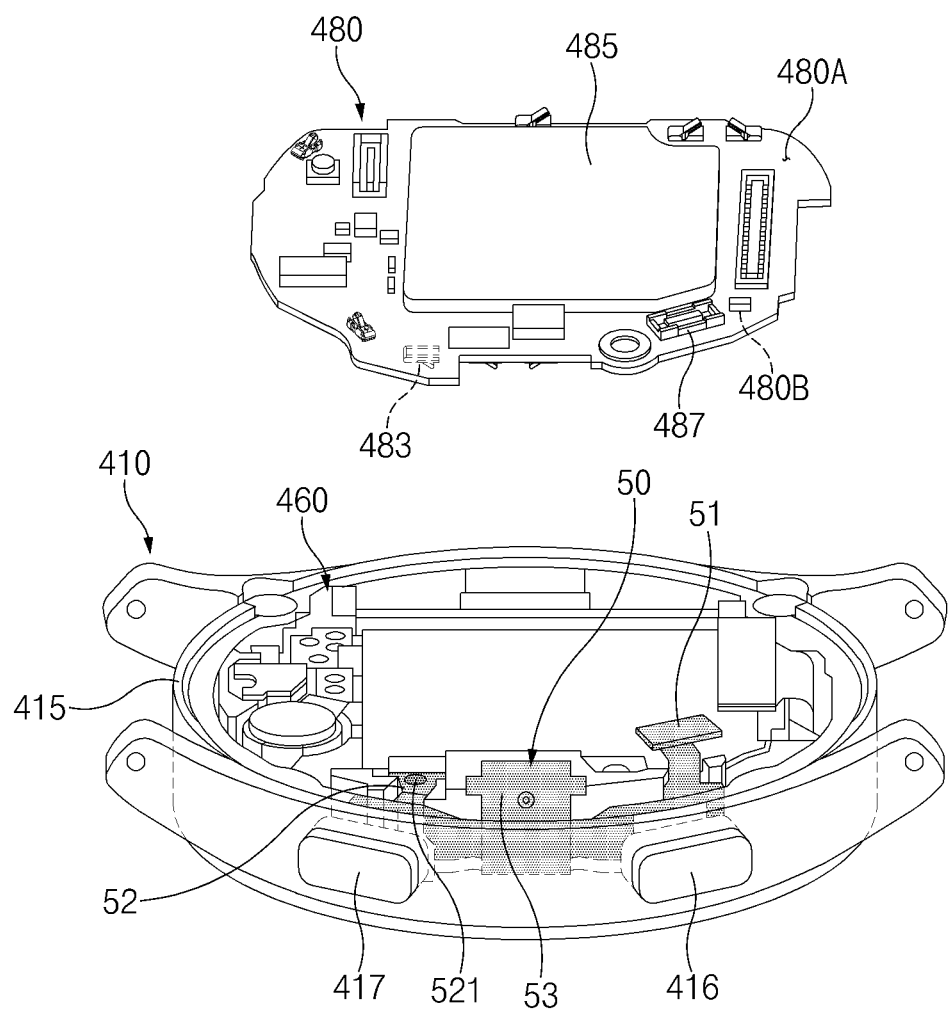
FIG. 5 is a perspective view illustrating example configurations of an electronic device according to various embodiments.

FIG. 5 is a perspective view illustrating various example configurations of an electronic device according to various embodiments.

Figure 6:
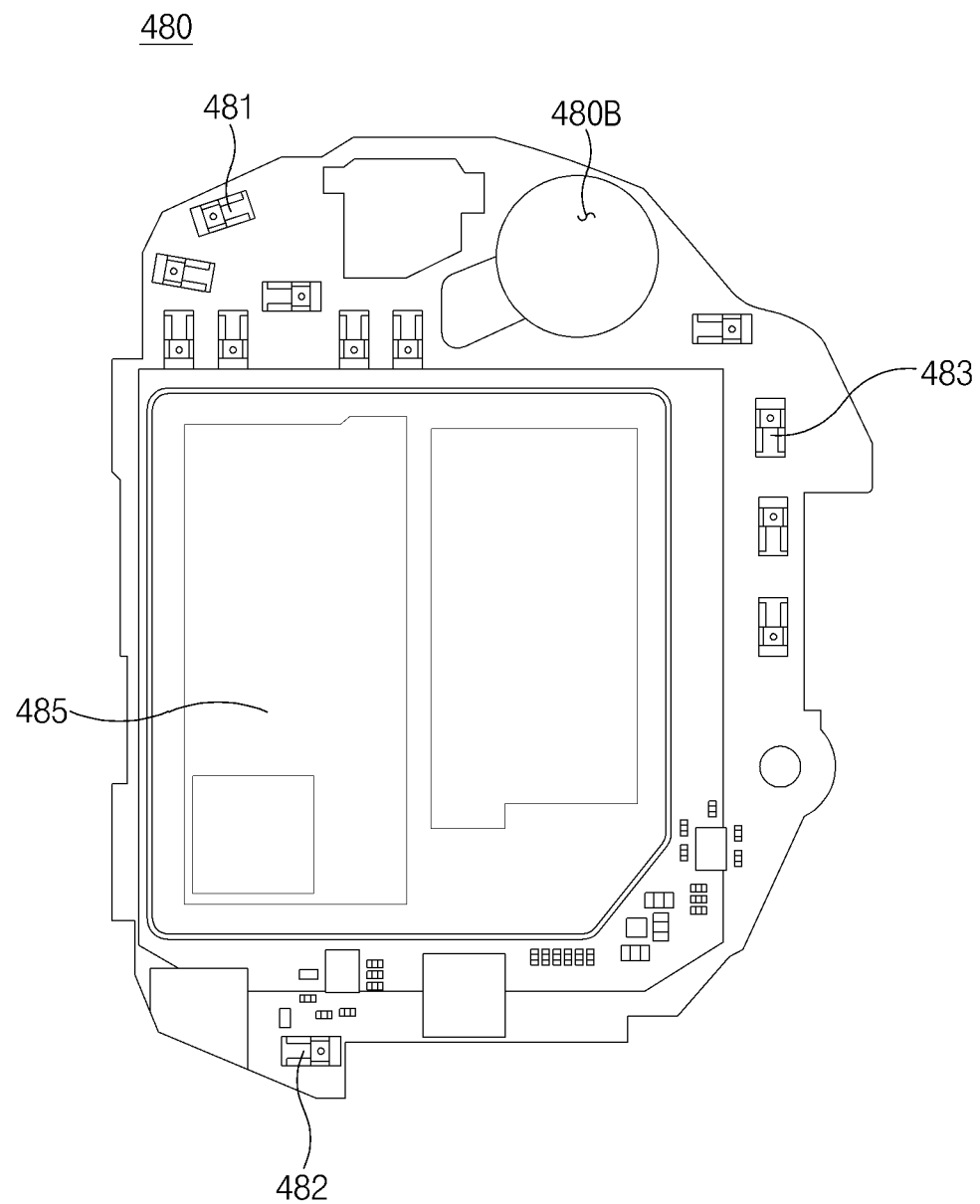
FIG. 6 is a diagram illustrating a surface of a printed circuit board according to various embodiments.

FIG. 6 is a diagram illustrating a surface of a printed circuit board according to various embodiments.

Referring to FIGS. 4, 5, and 6, an electronic device 400 (e.g., the electronic device 300 of FIG. 3) according to an embodiment may include a printed circuit board 480, a bracket 460, a housing 410, a connection member (e.g., including a printed circuit board, a rigid-flexible printed circuit board and/or flexible printed circuit board or the like including at least one conductor) 50, a first button 416, a second button 417, and a display 420.

In an embodiment, the printed circuit board 480 (e.g., the printed circuit board 380 of FIG. 3) may include a first surface 480A and a second surface 480B that faces the first surface 480A. For example, the first surface 480A of the printed circuit board 480 may face a first direction 1, and the second surface 480B may face a second direction 2 that is opposite to the first direction 1.

In an embodiment, although not illustrated, various electronic components (e.g., the processor 1020 and the wireless communication module 1092) may be disposed on the first surface 480A and/or the second surface 480B of the printed circuit board 480. In an embodiment, a protection member 485 that protects the electronic components disposed in the printed circuit board 480 may be disposed on the first surface 480A and/or the second surface 480B of the printed circuit board 480. For example, the protection member 485 may include an insulation member (e.g., a resin) that covers the electronic components to protect the electronic components and may include a conductive layer (e.g., conformal shield) formed on a surface of the insulation member to shield electromagnetic interferences (EMIs) and/or include a shield can that covers the electronic components. However, the disclosure is not limited thereto.

In an embodiment, the printed circuit board 480 may be disposed on the bracket 460. For example, the printed circuit board 480 may be disposed in the first direction 1 of the bracket 460. In an embodiment, the second surface 480B of the printed circuit board 480 may face the bracket 460.

In an embodiment, the housing 410 (e.g., the side bezel structure 310 of FIG. 3) may include a side wall 415 that defines at least a portion of a side surface (the side surface 110C of FIG. 2) of the electronic device 400. In an embodiment, the side wall 415 may extend in a height direction (e.g., the first direction 1) of the electronic device 400, and may surround the bracket 460. In an embodiment, when the housing 410 is viewed from a top (e.g., viewed in the first direction 1 or the second direction 2), a shape of the side wall 415 may be substantially circular. However, the disclosure is not limited thereto, and the side wall 415 may have various shapes such as a rectangular shape, a rectangular shape having round corners, or a polygonal shape.

In an embodiment, the housing 410 may include a first point 411 and a second point 412 formed on the side wall 415 or protruding from the side wall 415 inwards.

In an embodiment, the side wall 415 of the housing 410 may include a first part 413 extending from the first point 411 to the second point 412 in one direction (e.g., a counterclockwise direction) and having a first length, and a second part 414 extending from the first point 411 to the second point 412 in another direction (e.g., a clockwise direction) and having a second length that is smaller than the first length.

In an embodiment, the electronic device 400 may include an antenna including at least a portion of the housing 410 as an antenna element. In an embodiment, the housing 410 may receive electric power at the first point 411 and be grounded at the second point 412 to be operated as an antenna for transmitting and receiving a wireless signal.

In an embodiment, the first point 411 of the housing 410 may contact a first connector 481 disposed on the second surface 480B of the printed circuit board 480. The first connector 481, for example, may include a C-clip connector, but the disclosure is not limited thereto. In an embodiment, a wireless communication circuit (e.g., the wireless communication circuit 1092 of FIG. 10) disposed in the printed circuit board 480 may be electrically connected to the first point 411 of the housing 410 through a transmission line formed in the printed circuit board 480 and the first connector 481 electrically connected to the transmission line.

In an embodiment, the second point 412 of the housing 410 may contact a second connector 482 disposed on the second surface 480B of the printed circuit board 480. The second connector 482, for example, may include a C-clip connector, but the disclosure is not limited thereto. In an embodiment, the second point 412 of the housing 410 may be electrically connected to a ground plane of the printed circuit board 480 through the second connector 482. The ground plane may include a copper layer located on at least one layer of the printed circuit board 480. The ground plane may have one or a plurality of areas, on one or a plurality of the printed circuit board. In this regard, the ground plane may be referred to as at least one ground part.

In an embodiment, the housing 410 may form a first resonance frequency corresponding to a first specific band (e.g., a low-band (LB) of less than 1 GHz, but not limited thereto), and a second resonance frequency corresponding to a second specific band (e.g., a mid-band (MB) of 1 GHz to 2.3 GHz, but not limited thereto). For example, the housing 410 may receive electric power at the first point 411 and is short-circuited with the ground plane (ground) at the second point 412 to form the first resonance frequency band and/or the second resonance frequency band. The first resonance frequency and the second resonance frequency may be different according to circumferential lengths (e.g., the first length and the second length) of the first part 413 and the second part 414 of the housing 410, which are classified into the first point 411 and the second point 412. The first resonance frequency and the second resonance frequency may be different according to a current path including the first part 413 and the second part 414 of the housing 410.

In an embodiment, the wireless communication circuit may transmit and receive wireless signals of the first specific band and the second specific band by feeding electric power to the first point 411 of the housing 410.

In an embodiment, the bracket 460 (e.g., the support member 360 of FIG. 3) may be at least partially accommodated in a space formed in the housing 410. For example, the bracket 460 may be disposed in an interior of the side wall 415 of the housing 410. In an embodiment, the bracket 460 may be spaced apart from the side wall 415 of the housing 410. For example, the bracket 460 may include a side surface 460C that faces the side wall 415, and the side surface 460C of the bracket 460 may be at least partially spaced apart from the side wall 415.

In an embodiment, the bracket 460 may support the printed circuit board 480 and the connection member 50.

In an embodiment, the connection member 50 may include a flexible printed circuit board or a rigid-flexible printed circuit board, at least a portion of which may be deflected.

In an embodiment, the connection member 50 may be at least partially disposed between the bracket 460 and the side wall 415. For example, the connection member 50 may be partially seated in an accommodation recess 462 formed on the side surface 460C of the bracket 460, and may be located between the bracket 460 and the side wall 415.

In an embodiment, the connection member 50 may be fixedly disposed on the side surface 460C of the bracket 460.

For example, the connection member 50 may be coupled to the bracket 460, in a scheme in which a protrusion formed in the accommodation recess 462 and a hole 537 formed in the connection member 50. As another example, the connection member 50 may be coupled to the bracket 460 through a bonding member (e.g., a double-sided table) or a fixing member (e.g., a screw).

In an embodiment, the connection member 50 may at least partially overlap the side wall 415 of the housing 410 and/or the bracket 460 when the side surface of the electronic device 400 is viewed (e.g., viewed in a direction that is perpendicular to the first direction 1).

In an embodiment, the connection member 50 may be disposed between the bracket 460 and the first part 413 of the housing 410. For example, the connection member 50 may be closer to the first part 413 of the housing 410 than to the second part 414. Meanwhile, the disclosure is not limited thereto, and as another example, unlike the illustration, the connection member 50 may be disposed between the bracket 460 and the second part 414 of the housing 410.

In an embodiment, the connection member 50 may include a first part 51, a second part 52, and an extension part 53.

In an embodiment, the extension part 53 may be located between the bracket 460 and the side wall 415. In an embodiment, the extension part 53 may extend along the side wall 415 (or the side surface 460C of the bracket 460) of the housing 410. In an embodiment, the extension part 53 may be at least partially accommodated in the accommodation recess 462 of the bracket 460.

In an embodiment, one end 53A of the extension part 53 may be located between the first button 416 and the bracket 460, and an opposite end 53B thereof may be located between the second button 417 and the bracket 460.

In an embodiment, various components of the electronic device 400 may be disposed in the extension part 53. For example, a first component 531, a second component 532, and a third component 533 may be disposed in the extension part 53.

In an embodiment, the first component 531 may include a first dome switch and/or a first biometric sensor (or a first biometric sensor structure for detecting first biometric information). In an embodiment, the first dome switch may be pressed by the first button 416 (e.g., the key input device 104 of FIG. 1) according to a manipulation by the user to generate an electrical signal. In an embodiment, the first biometric sensor may include a conductive structure, and the conductive structure may be electrically connected to the first button 416 at least partially formed of a conductive material. The first biometric sensor and the first button 416 may be operated as electrodes for detecting biometric information of the user when the body of the user contacts the first button 416. In an embodiment, a signal detected through the first biometric sensor and the first button 416 may be delivered to the processor (e.g., the processor 1020 of FIG. 10) of the electronic device 400 through the connection member 50, and the processor may acquire first biometric information of the user based on the detected signal. In an embodiment, the first biometric sensor may include a bioelectrical impedance analysis (BIA) sensor, and the first biometric information may include information of components of the body of the user, but the disclosure is not limited thereto.

In an embodiment, the second component 532 may include a second dome switch and/or a second biometric sensor (or a second biometric sensor structure for detecting second biometric information) that is different from the first biometric sensor. In an embodiment, the second dome switch may be pressed by the second button 417 according a manipulation by the user to generate an electrical signal. In an embodiment, the second biometric sensor may include a second conductive structure, and the second conductive structure may be electrically connected to the second button 417 at least partially formed of a conductive material. In an embodiment, the second biometric sensor and the second button 417 may be operated as electrodes for detecting biometric information of the user when the body of the user contacts the second button 417. In an embodiment, a signal detected by the second biometric sensor and the second button 417 may be delivered to the processor through the connection member 50. The processor may acquire the second biometric information of the user based on the detected signal. In an embodiment, the second biometric sensor may include a bioelectrical impedance analysis (BIA) sensor, and the second biometric information may include electrocardiogram information of the user, but the disclosure is not limited thereto.

According to an embodiment, the first component 531 and/or the second component 532 may include biometric sensors, and the biometric sensors may be conductive structures (e.g., the conductive plate) to be electrically connected (or conductively connected) to the buttons 416 and 417 in order that the electronic device 400 acquires the biometric information of the user. The conductive structures may include contact parts 5311 and 5321 (refer to FIG. 7) that at least partially contact the buttons 416 and 417, and fixed parts 5312 and 5322 (refer to FIG. 7) that extend from the contact parts 5311 and 5321 and are electrically connected to ends 53A and 53B of the connection member 50. In an embodiment, the dome switches may be disposed between the conductive structures and one surface of the connection member 50.

The electronic device according to an embodiment may include an analog-digital converter (not illustrated) that processes analog signals detected by the first biometric sensor and the second biometric sensor and delivers the digital signals to the processor. The analog-digital converter may be disposed in the printed circuit board 480, but the disclosure is not limited thereto.

In an embodiment, a third component 533 may be disposed between the first component 531 and the second component 532, in the extension part 53. In an embodiment, the third component 533 may include an acoustic sensor. In an embodiment, the third component 533 may be located between the extension part 53 and the bracket 460. In an embodiment, a microphone hole 535, through which sounds are introduced, may be formed in the third component 533, and the microphone hole 535 may be aligned with an opening 536 formed in the extension part 53 to be communicated with the opening 536.

In an embodiment, the first component 531, the second component 532, and the third component 533, which have been described above, are not limited by the above-described example, and may be replaced by components having functions that are different from the above-described ones.

In an embodiment, the first part 51 of the connection member 50 may extend from one end 53A of the extension part 53. In an embodiment, the first part 51 of the connection member 50 may extend from the one end 53A of the extension part 53 to face the first surface 480A of the printed circuit board 480. In an embodiment, the first part 51 may be disposed on the first surface 480A of the printed circuit board 480. For example, the first part 51 may include a plug 511 of a connector, and a receptacle 487 of the connector may be disposed on the first surface 480A of the printed circuit board 480. In an embodiment, the first part 51 may be disposed on the first surface 480A of the printed circuit board 480 in a scheme, in which the plug 511 and the receptacle 487 are coupled to each other. Meanwhile, the disclosure is not limited to the connector structure including the above-described receptacle-plug to connect to the connection member 50 to the printed circuit board 480, and various schemes that may be applied by an ordinary person may be used. In an embodiment, the first part 51 may be disposed on the second surface 480B of the printed circuit board 480.

In an embodiment, at least one processor (e.g., the processor 1020 of FIG. 10) disposed in the printed circuit board 480 may be operatively connected to the first component 531, the second component 532, and the third component 533 through the connection member 50. For example, the at least one processor may be electrically connected to the first component 531, the second component 532, and the third component 533 through a conductive trace (or pattern) formed in the printed circuit board 480 and the connection member 50. In an embodiment, the at least one processor may transmit and/or receive an electrical signal to and from the first component 531, the second component 532, and the third component 533. The electrical signal may be delivered through the first part 51 of the connection member 50.

In an embodiment, the second part 52 of the connection member 50 may extend from an opposite end 53B of the extension part 53. In an embodiment, the second part 52 of the connection member 50 may extend from the opposite end 53B of the extension part 53 to face the second surface 480B of the printed circuit board 480. In an embodiment, the second part 52 may be disposed on the second surface 480B of the printed circuit board 480. In an embodiment, a conductive area 521 (or a conductive pad), in which a conductive pattern of the connection member 50 is partially exposed, may be formed in the second part 52. In an embodiment, the conductive area 521 may face the second surface 480B of the printed circuit board 480. In an embodiment, the conductive area 521 may contact a third connector 483. In an embodiment, the conductive area 521 may be electrically connected to the ground plane of the printed circuit board 480 through the third connector 483. In an embodiment, the third connector 483, for example, may include a C-clip connector, but the disclosure is not limited thereto. In an embodiment, the second part 52 of the connection member 50 may be disposed on the first surface 480A of the printed circuit board 480.

In an embodiment, the connection member 50 may include a plurality of conductive traces (or patterns). The plurality of conductive traces may include signal lines and power lines for operations of the first component 531, the second component 532, and the third component 533, and a plurality of ground lines. In an embodiment, at least some of the plurality of ground lines may be electrically connected to the conductive area 521 of the second part 52 directly or indirectly (e.g., through another ground line). The plurality of ground lines may be electrically connected to the ground plane of the printed circuit board 480 through the conductive area 521 of the second part 52.

In an embodiment, the connection member 50 may form a loop structure, in which the first part 51 is disposed in the printed circuit board 480 to be operatively connected to the at least one processor and the second part 52 is electrically connected to the ground area of the printed circuit board 480. Because the opposite ends (e.g., the first part 51 and the second part 52) of the connection member 50 form the loop structure, noise and/or parasite components may be reduced, and thus lowering of a performance of the antenna may be alleviated or prevented. Differences between the effects of the embodiment of the disclosure and the comparative example will be described in greater detail below with reference to FIGS. 8 and 9.

In an embodiment, the first button 416 and the second button 417 may be at least partially exposed through the housing 410. In an embodiment, the first button 416 and the second button 417 may at least partially overlap the connection member 50 when the side surface (e.g., the side surface 110C of FIG. 2) of the housing 410 is viewed (e.g., viewed in a direction that is perpendicular to the first direction 1). In an embodiment, the first button 416 and the second button 417 may at least partially overlap the extension part 53 of the connection member 50 when the side wall 415 of the housing 410 is viewed (e.g., viewed in the direction that is perpendicular to the first direction 1). For example, the first button 416 may at least partially overlap the one end 53A of the extension part 53 and the second button 417 may at least partially overlap the opposite end 53B of the extension part 53.

In an embodiment, the display 420 (e.g., the display 120 of FIG. 3) may be disposed in the housing 410. In an embodiment, the bracket 460 may be disposed between the display 420 and the printed circuit board 480. For example, the printed circuit board 480 may be disposed in one direction (e.g., the first direction 1) of the bracket 460 to be supported, and the display 420 may be disposed in another direction (e.g., the second direction 2) to be supported.

Figure 7:
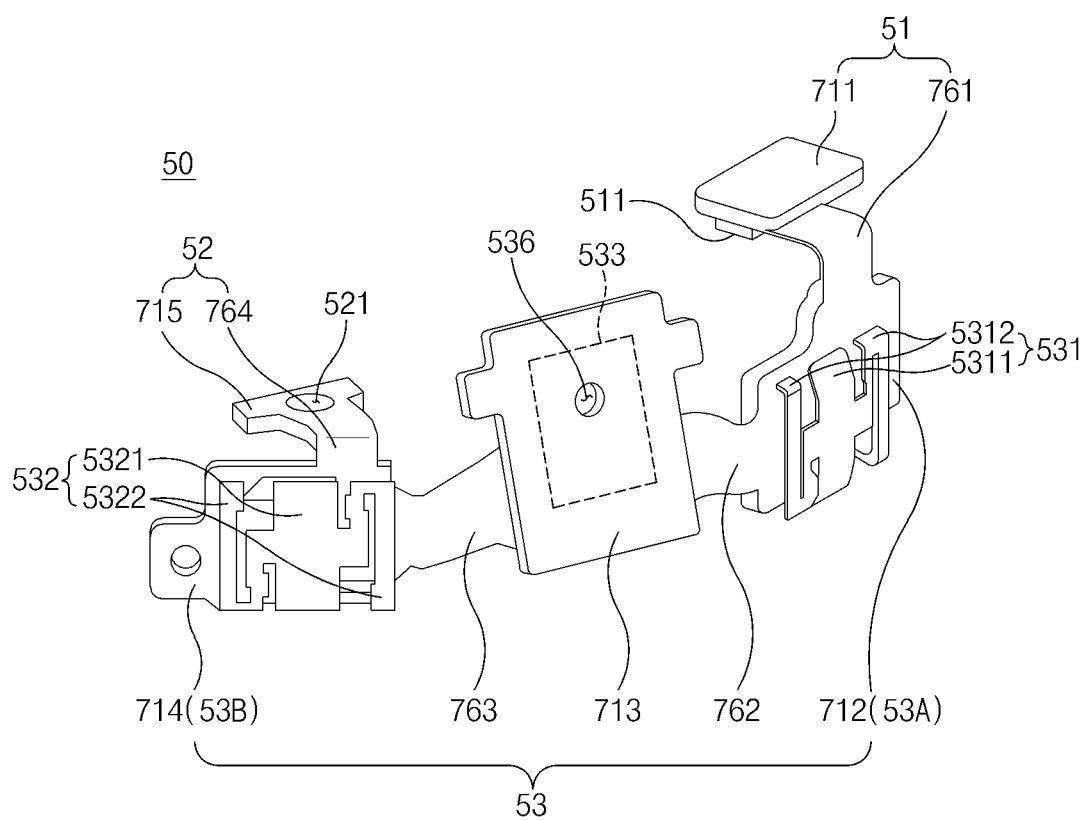
FIG. 7 is a perspective view illustrating an example connection member according to various embodiments.

FIG. 7 is a perspective view illustrating a connection member according to various embodiments.

In FIG. 7, a repeated description of configurations having the same reference numerals as the above-described configurations may not be repeated here.

Referring to FIG. 7, the connection member 50 according to the embodiment may be at least partially deflected. In an embodiment, the connection member 50 may include a flexible portion(s) and a rigid portion(s). For example, the connection member 50 may include a first rigid portion 711, a second rigid portion 712, a third rigid portion 713, a fourth rigid portion 714, a fifth rigid portion 715, a first flexible portion 761, a second flexible portion 762, a third flexible portion 763, and a fourth flexible portion 764.

In an embodiment, the plug 511 may be disposed at the first rigid portion 711. In an embodiment, the first flexible portion 761 may connect the first rigid portion 711 and the second rigid portion 712. For example, the first flexible portion 761 may extend from the first rigid portion 711 to the second rigid portion 712. In an embodiment, the first rigid portion 711 and the first flexible portion 761 may be referred to as the first part 51 of the connection member 50 in that they extend from the one end 53A of the extension part 53.

In an embodiment, the first component 531 may be disposed at the second rigid portion 712.

In an embodiment, the second flexible portion 762 may connect the second rigid portion 712 and the third rigid portion 713. For example, the second flexible portion 762 may extend from the second rigid portion 712 to the third rigid portion 713.

In an embodiment, the third component 533 may be disposed at the third rigid portion 713, and the opening 536 communicated with the microphone hole (e.g., 535 of FIG. 4) of the third component 533 is formed at the third rigid portion 713

In an embodiment, the third flexible portion 763 may connect the third rigid portion 713 and the fourth rigid portion 714. For example, the third flexible portion 763 may extend from the third rigid portion 713 to the fourth rigid portion 714 in a direction that is farther away from the second flexible portion 762.

In an embodiment, the second component 532 may be disposed at the fourth rigid portion 714.

In an embodiment, the second rigid portion 712, the second flexible portion 762, the third rigid portion 713, the third flexible portion 763, and the fourth rigid portion 714 may extend along the side wall (415 of FIG. 4) of the housing 410 or the side surface (460C of FIG. 4) of the bracket (460 of FIG. 4). In this regard, the second rigid portion 712, the second flexible portion 762, the third rigid portion 713, the third flexible portion 763, and the fourth rigid portion 714 may be referred to as the extension part 53 of the connection member 50. In an embodiment, the one end 53A of the connection member 50 may be understood as including at least a portion of the second rigid portion 712. In an embodiment, the opposite end 53B of the connection member 50 may be understood as including at least a portion of the fourth rigid portion 714.

In an embodiment, the conductive area 521 may be disposed at the fifth rigid portion 715. The conductive area 521 may be a pad (or a conductive pad) to be electrically connected to the ground area of the printed circuit board 480 through the third connector 483.

In an embodiment, the fourth flexible portion 764 may connect the fourth rigid portion 714 and the fifth rigid portion 715. The fourth flexible portion 764 may extend from the fourth rigid portion 714 to the fifth rigid portion 715.

In an embodiment, the fourth flexible portion 764 and the fifth rigid portion 715 may be referred to as the second part 52 of the connection member 50 in that they extend from the opposite end 53B of the extension part 53.

However, the above-described classification of the rigid portions and flexible portions is merely an example and various design modifications may be made. For example, when the third component 533 is omitted, the third rigid portion 713 may be replaced by a flexible portion. As another example, it has been described that the one end 53A (or the opposite end 53B) of the extension part 53 includes at least a portion of the second rigid portion 712 (or the fourth rigid portion 714), but in an embodiment, the one end 53A and/or the opposite end 53B of the extension part 53 may at least partially include a flexible portion.

According to an example embodiment, an electronic device (e.g., the electronic device 400 of FIG. 4) that is wearable may include: a housing (e.g., the housing 410 of FIG. 4) including a side wall (e.g., the side wall 415 of FIG. 4) at least partially configured as an antenna, a first printed circuit board (e.g., the first printed circuit board 480 of FIG. 4) disposed in the housing and including at least one ground part, a second printed circuit board (e.g., the second printed circuit board 480 of FIG. 4), wherein the second printed circuit board includes an extension part (e.g., the extension part 53 of FIG. 4) extending along the side wall of the housing, a first part (e.g., the first part 51 of FIG. 4) extending from one end (e.g., the one end 53A of FIG. 4) of the extension part and connected to the first printed circuit board, and a second part (e.g., the second part 52 of FIG. 4) extending from an opposite end (e.g., the opposite end 53B of FIG. 4) of the extension part and electrically connected to the at least one ground part, wherein at least one component is disposed on the extension part, and a processor (e.g., the processor 1020 of FIG. 10) disposed on the first printed circuit board, and operatively connected to the at least one component through the first part of the second printed circuit board.

The electronic device according to an example embodiment may include a bracket (e.g., the bracket 460 of FIG. 4) disposed in the housing supporting the first printed circuit board, wherein the bracket may be at least partially spaced apart from the side wall, and the extension part of the second printed circuit board may be located between the bracket and the side wall.

In an example embodiment, the first printed circuit board may include a receptacle (e.g., the receptacle 487 of FIG. 4) disposed on a first surface (e.g., the first surface 480A of FIG. 4) of the first printed circuit board and a second surface (e.g., the second surface 480B of FIG. 5) opposite to the first surface, and the second printed circuit board may include a plug (e.g., the plug 511 of FIG. 4) disposed in the first part and coupled to the receptacle.

In an example embodiment, the first part of the second printed circuit board may include a first rigid portion (e.g., the first rigid portion 711 of FIG. 7) and a first flexible portion (e.g., the first flexible portion 761 of FIG. 7), the plug may be disposed at the first rigid portion, the first flexible portion may extend from the first rigid portion to the one end of the extension part.

In an example embodiment, the electronic device may include: a first button (e.g., the first button 416 of FIG. 4) and a second button (e.g., the second button 417 of FIG. 4) at least partially exposed through the side wall of the housing, and when the side wall of the housing is viewed in an inward direction of the electronic device, the first button and the second button may at least partially overlap the extension part.

In an example embodiment, the first button may at least partially overlap the one end of the extension part, and the second button may at least partially overlap the opposite end of the extension part.

In an example embodiment, the at least one component includes: a first component (e.g., the first component 531 of FIG. 4), a second component (e.g., the second component 532 of FIG. 4), and a third component (e.g., the third component 533 of FIG. 4) located between the first component and the second component, the first component may include a first dome switch operatively connected to the first button and a first biometric sensor structure including at least one sensor, and the second component may include a second dome switch operatively connected to the second button and a second biometric sensor structure including at least one sensor that is different from the first biometric sensor structure.

In an example embodiment, the extension part of the second printed circuit board may include: a second rigid portion (e.g., the second rigid portion 712 of FIG. 7), at which the first component is disposed, a third rigid portion (e.g., the third rigid portion 713 of FIG. 7), at which the third component is disposed, a second flexible portion (e.g., the second flexible portion 762 of FIG. 7) connecting the second rigid portion and the third rigid portion; a fourth rigid portion (e.g., the fourth rigid portion 714 of FIG. 7), at which the second component is disposed, and a third flexible portion (e.g., the third flexible portion 763 of FIG. 7) connecting the third rigid portion and the fourth rigid portion, wherein one end of the extension part may at least partially include the second rigid portion, and an opposite end of the extension part may at least partially include the fourth rigid portion.

In an example embodiment, the first biometric sensor structure and/or the second biometric sensor structure may include a conductive structure configured to acquire a bioelectrical impedance analysis (BIA) sensor signal and/or an electrocardiogram (ECG) sensor signal, and the third component may include an acoustic sensor.

In an example embodiment, the second printed circuit board may include a plurality of ground lines, the second part may include a conductive area (e.g., the conductive area 521 of FIG. 7) exposed toward the first printed circuit board, at least some of the plurality of ground lines may be electrically connected to the conductive area, and at least some of the plurality of ground lines may be electrically connected to the at least one ground part of the first printed circuit board through the conductive area.

In an example embodiment, the second part may include a fifth rigid portion (e.g., the fifth rigid portion 715 of FIG. 7), and a fourth flexible portion (e.g., the fourth flexible portion 764 of FIG. 7) connecting the fifth rigid portion and the opposite end of the extension part, and the conductive area may be formed at the fifth rigid portion.

In an example embodiment, the electronic device may include: a C-clip (e.g., the third connector 483 of FIG. 4) disposed on a first surface of the first printed circuit board and a second surface opposite to the first surface, and the conductive area may be electrically connected to the at least one ground part of the first printed circuit board while contacting the C-clip.

In an embodiment, the electronic device may include: a wireless communication circuit (e.g., the wireless communication module 1092 of FIG. 10) disposed in the first printed circuit board, the housing may be electrically connected to the wireless communication circuit at a first point (e.g., the first point 411 of FIG. 4) such that electric power is fed thereto, and the housing may be electrically connected to the at least one ground part of the first printed circuit board at a second point (e.g., the second point 412 of FIG. 4).

In an example embodiment, the side wall of the housing may include a first part (e.g., the first part 413 of FIG. 4) extending from the first point to the second point in a first direction, and a second part (e.g., the second part 414 of FIG. 4) extending from the first point to the second point in a second direction different from the first direction, a length of the first part of the side wall may be greater than a length of the second part, and the second printed circuit board may be closer to the first part of the side wall than to the second part.

In an example embodiment, the electronic device may include a display (e.g., the display 420 of FIG. 4), and the bracket may be disposed between the display and the first printed circuit board.

A wearable electronic device (e.g., the electronic device 400 of FIG. 4) according to an example embodiment may include: a housing (e.g., the housing 41'0 of FIG. 4) including a side wall (e.g., the side wall of FIG. 4) that is at least partially configured to be used as an antenna, a printed circuit board (e.g., the printed circuit board 480 of FIG. 4) disposed in the housing and including at least one ground part, a connection member comprising a conductor (e.g., the connection member 50 of FIG. 4), wherein the connection member includes an extension part (e.g., the extension part 53 of FIG. 4) extending along the side wall of the housing, a first part (e.g., the first part 51 of FIG. 4) extending from one end (the one end 53A of FIG. 4) of the extension part and connected to the printed circuit board, and a second part (e.g., the second part 52 of FIG. 4) extending from an opposite end (e.g., the opposite end 53B of FIG. 4) of the extension part and electrically connected to the at least one ground part, at least one component disposed on the extension part, and at least one processor (e.g., the processor 1020 of FIG. 10) disposed on the printed circuit board, and operatively connected to the at least one component through the connection member, the connection member may include a plurality of ground lines, and at least some of the plurality of ground lines may be electrically connected to the at least one ground part of the printed circuit board through the second part.

The wearable electronic device according to an example embodiment may include a C-clip (e.g., the third connector 483 of FIG. 4) disposed on the printed circuit board, the second part having a conductive area (e.g., the conductive area 521 of FIG. 4) exposed toward the printed circuit board, and at least some of the plurality of ground lines may be electrically connected to the conductive area, and may be electrically connected to at least one ground part of the printed circuit board through the C-clip in contact with the conductive area.

The wearable electronic device according to an example embodiment may include a first button (e.g., the first button 416 of FIG. 4) and a second button (e.g., the second button 417 of FIG. 4) at least partially exposed through the side wall of the housing, and the first button and the second button may at least partially overlap the extension part.

In an example embodiment, the first button may at least partially overlap the one end of the connection member, and the second button may at least partially overlap the opposite end of the connection member.

The wearable electronic device according to an example embodiment may include a bracket (e.g., the bracket 460 of FIG. 4) disposed in the housing supporting the first printed circuit board, the bracket may be at least partially spaced apart from the side wall, and the extension part of the connection member may be located between the bracket and the side wall.

Figure 8:
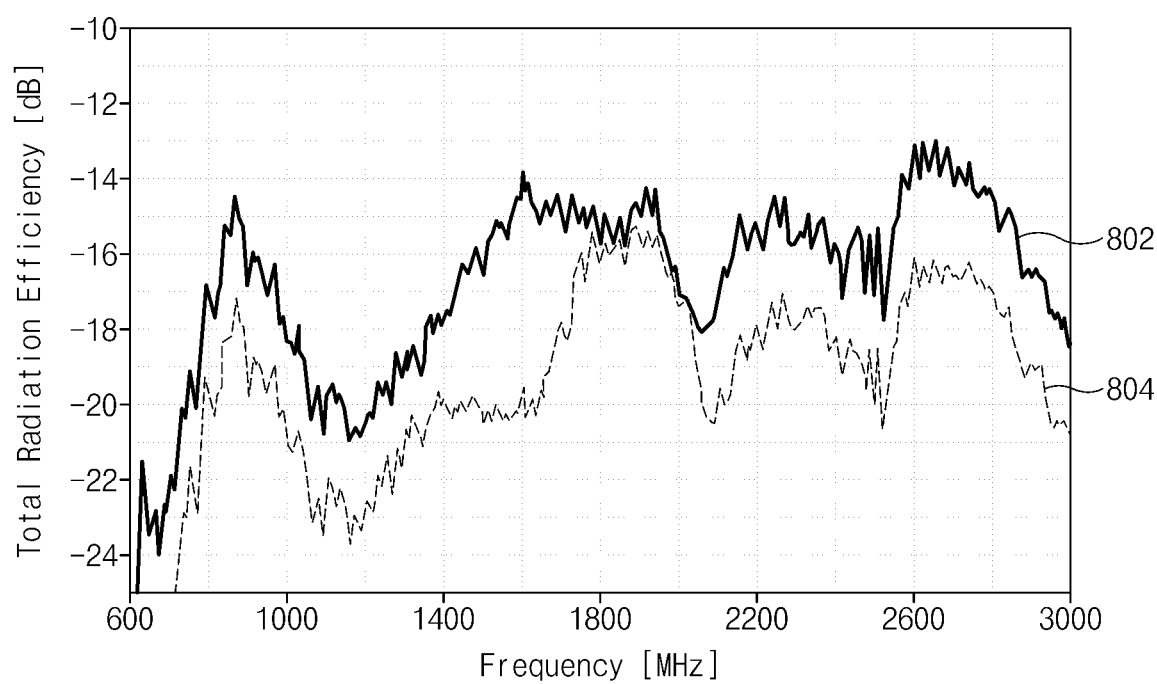
FIG. 8 is a graph depicting total radiation efficiencies of an electronic device according to various embodiments and an electronic device according to a comparative example.

FIG. 8 is a graph illustrating total radiation efficiencies of an electronic device according to an example embodiment and an electronic device according to a comparative example.

Figure 9:
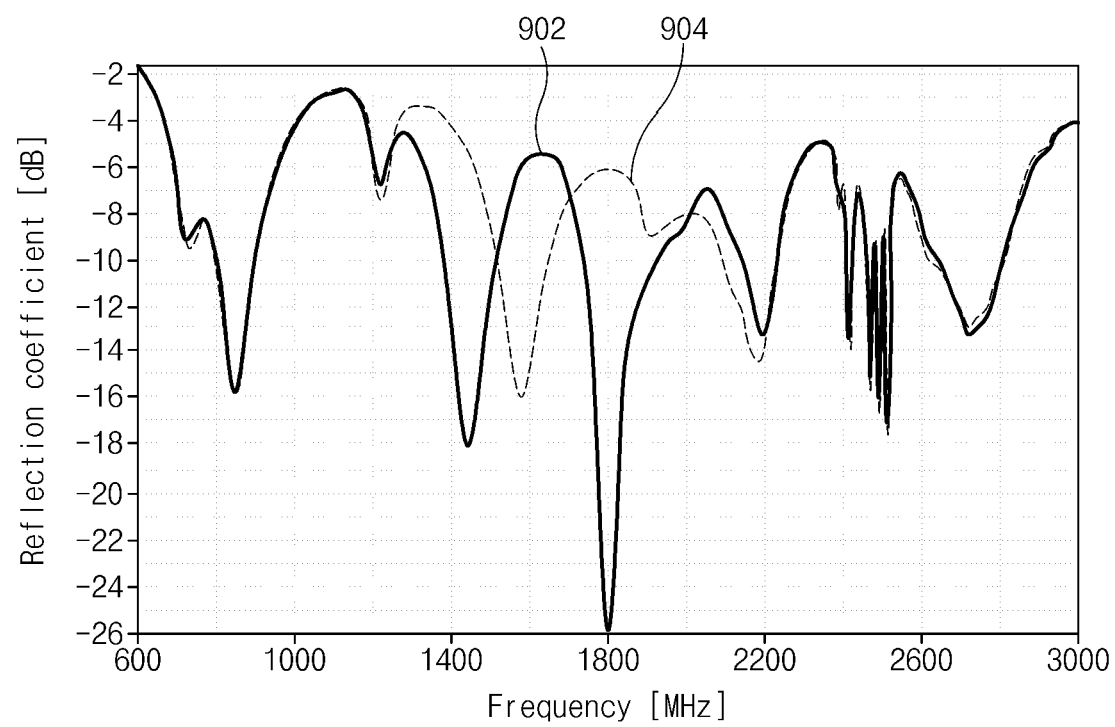
FIG. 9 is a graph depicting reflection coefficients (or return losses [dB]) of an electronic device according to various embodiments and an electronic device according to a comparative example.

FIG. 9 is a graph illustrating reflection coefficients (or return losses [dB]) of an electronic device according to an example embodiment and an electronic device according to a comparative example.

In FIGS. 8 and 9, reference numerals 802 and 902 may be graphs of an electronic device according to various embodiments, and reference numerals 804 and 904 may be graphs of an electronic device according to a comparative example.

Unlike the connection member 50 of the electronic device according to various embodiments disclosed herein, the connection member of the electronic device according to the comparative example of FIGS. 8 and 9 may be electrically connected to the ground area of the printed circuit board 480 using only the first part 51 and may not include a loop structure. For example, the second part 52 electrically connected to the ground plane of the printed circuit board 480 according to the embodiment may be omitted from the electronic device according to the comparative example.

The connection member of the electronic device according to the comparative example may influence a radiation field of the antenna with noise and parasites, and may deteriorate a performance of the antenna. In particular, the antenna structure forms a field using a conductive pattern (e.g., an outer conductive side wall) formed in at least a partial area of the housing 410, and the connection member disposed in parallel to the side wall 415 of the housing 410

(or perpendicularly to the electronic device) may be recognized as another antenna element distinguished from the housing 410 and may deteriorate the performance of the antenna.

The electronic device according to an embodiment may include the connection member 50, opposite ends of which form a loop structure. For example, the first part 51 that is one end of the connection member 50 may be disposed in the printed circuit board 480 to be electrically connected to the at least one processor, and the second part 52 that is an opposite end of the connection member 50 may be electrically connected to the ground plane of the printed circuit board 480. The connection member 50 including a loop structure according to an embodiment may reduce and/or prevent lowering of the performance of the antenna because it does not act as a parasite component even when the housing 410 is operated as an antenna.

For example, referring to FIG. 8, the radiation efficiency 802 of the electronic device according to an embodiment may be improved in all the frequency band as compared with the radiation efficiency 804 of the electronic device according to the comparative example.

As another example, referring to FIG. 9, the reflection coefficient 902 of the electronic device according to the embodiment may be lower in a band of about 1200 MHz to 1500 MHz and a band of about 1700 MHz to 2000 MHz than the reflection coefficient 904 of the electronic device according to the comparative example. Through this, the communication performance of the frequency band, which the electronic device utilizes for communication may be improved.

Figure 10:
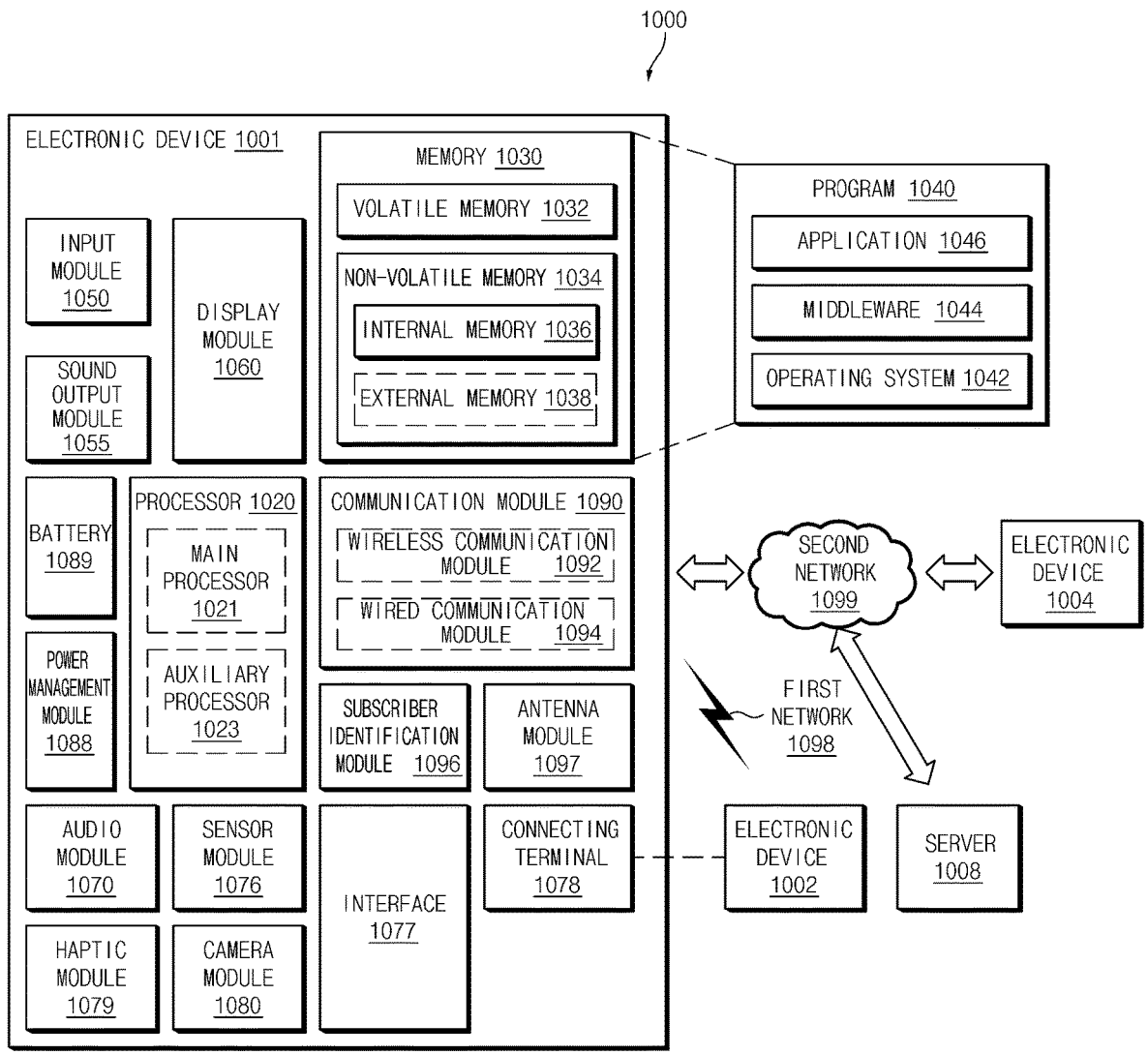
FIG. 10 is a block diagram illustrating an example electronic device in a network environment according to various embodiments.

FIG. 10 is a block diagram illustrating an example electronic device 1001 in a network environment 1000 according to various embodiments.

Referring to FIG. 10, the electronic device 1001 in the network environment 1000 may communicate with an electronic device 1002 via a first network 1098 (e.g., a short-range wireless communication network), or at least one of an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input module 1050, a sound output module 1055, a display module 1060, an audio module 1070, a sensor module 1076, an interface 1077, a connecting terminal 1078, a haptic module 1079, a camera module 1080, a power management module 1088, a battery 1089, a communication module 1090, a subscriber identification module (SIM) 1096, or an antenna module 1097. In various embodiments, at least one of the components (e.g., the connecting terminal 1078) may be omitted from the electronic device 1001, or one or more other components may be added in the electronic device 1001. In various embodiments, some of the components (e.g., the sensor module 1076, the camera module 1080, or the antenna module 1097) may be implemented as a single component (e.g., the display module 1060).

The processor 1020 may execute, for example, software (e.g., a program 1040) to control at least one other component (e.g., a hardware or software component) of the electronic device 1001 coupled with the processor 1020, and may perform various data processing or computation. According to an embodiment, as at least part of the data processing or computation, the processor 1020 may store a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), or an auxiliary processor 1023 (e.g., a graphics processing unit (GPU), a neural processing unit (NPU), an image signal processor (ISP), a sensor hub processor, or a communication processor (CP)) that is operable independently from, or in conjunction with, the main processor 1021. For example, when the electronic device 1001 includes the main processor 1021 and the auxiliary processor 1023, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display module 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. According to an embodiment, the auxiliary processor 1023 (e.g., the neural processing unit) may include a hardware structure specified for artificial intelligence model processing. An artificial intelligence model may be generated by machine learning. Such learning may be performed, e.g., by the electronic device 1001 where the artificial intelligence is performed or via a separate server (e.g., the server 1008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input module 1050 may receive a command or data to be used by another component (e.g., the processor 1020) of the electronic device 1001, from the outside (e.g., a user) of the electronic device 1001. The input module 1050 may include, for example, a microphone, a mouse, a keyboard, a key (e.g., a button), or a digital pen (e.g., a stylus pen).

The sound output module 1055 may output sound signals to the outside of the electronic device 1001. The sound output module 1055 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1060 may visually provide information to the outside (e.g., a user) of the electronic device 1001. The display module 1060 may include, for example, a display, a hologram device, or a projector and control circuitry to control a corresponding one of the display, hologram device, and projector. According to an embodiment, the display module 1060 may include a touch sensor adapted to detect a touch, or a pressure sensor adapted to measure the intensity of force incurred by the touch.

The audio module 1070 may convert a sound into an electrical signal and vice versa. According to an embodiment, the audio module 1070 may obtain the sound via the input module 1050, or output the sound via the sound output module 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to an embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The wireless communication module 1092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1092 may support a high-frequency band (e.g., the mmWave band) to achieve, e.g., a high data transmission rate. The wireless communication module 1092 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1092 may support various requirements specified in the electronic device 1001, an external electronic device (e.g., the electronic device 1004), or a network system (e.g., the second network 1099). According to an embodiment, the wireless communication module 1092 may support a peak data rate (e.g., 20 Gbps or more) for implementing eMBB, loss coverage (e.g., 1064 dB or less) for implementing mMTC, or U-plane latency (e.g., 0.5 ms or less for each of downlink (DL) and uplink (UL), or a round trip of 10 ms or less) for implementing URLLC.

The antenna module 1097 may transmit or receive a signal or power to or from the outside (e.g., the external electronic device) of the electronic device 1001. According to an embodiment, the antenna module 1097 may include an antenna including a radiating element include a conductive material or a conductive pattern formed in or on a substrate (e.g., a printed circuit board (PCB)). According to an embodiment, the antenna module 1097 may include a plurality of antennas (e.g., array antennas). In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

According to various embodiments, the antenna module 1097 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 or 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, mobile edge computing (MEC), or client-server computing technology may be used, for example. The electronic device 1001 may provide ultra low-latency services using, e.g., distributed computing or mobile edge computing. In an embodiment, the external electronic device 1004 may include an internet-of-things (IoT) device. The server 1008 may be an intelligent server using machine learning and/or a neural network. According to an embodiment, the external electronic device 1004 or the server 1008 may be included in the second network 1099. The electronic device 1001 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device configured to be wearable, the electronic device comprising:
   a housing including a side wall at least partially configured as an antenna;
   a first printed circuit board (PCB) disposed in the housing and including at least one ground part;
   a bracket disposed in the housing and supporting the first PCB;
   a second PCB, wherein the second PCB includes:
      an extension part extending along the side wall of the housing;
      a first part extending from one end of the extension part and connected to a part of the first PCB different from the at least one ground part; and
      a second part extending from an opposite end of the extension part and electrically connected to the at least one ground part of the first PCB;
   at least one component disposed on the extension part; and
   a processor disposed on the first PCB, and operatively connected to the at least one component through the first part of the second PCB,
   wherein the bracket is at least partially spaced apart from the side wall, and
   wherein the extension part of the second PCB is located between the bracket and the side wall.

2. The electronic device of claim 1, wherein the first PCB includes a receptacle disposed on either a first surface of the first PCB or a second surface of the first PCB opposite the first surface, and
   wherein the second PCB includes a plug disposed in the first part and configured for coupling to the receptacle.

3. The electronic device of claim 2, wherein the first part of the second PCB includes a first rigid portion and a first flexible portion,
   wherein the plug is disposed at the first rigid portion, and
   wherein the first flexible portion extends from the first rigid portion to the one end of the extension part.

4. The electronic device of claim 1, comprising:
   a first button and a second button at least partially exposed through the side wall of the housing,
   wherein, when the side wall of the housing is viewed in an inward direction of the electronic device, the first button and the second button at least partially overlap the extension part.

5. The electronic device of claim 4, wherein the first button at least partially overlaps the one end of the extension part, and
   wherein the second button at least partially overlaps the opposite end of the extension part.

6. The electronic device of claim 5, wherein the at least one component includes a first component, a second component, and a third component located between the first component and the second component,
   wherein the first component includes a first dome switch operatively connected to the first button and a first biometric sensor, and
   wherein the second component includes a second dome switch operatively connected to the second button and a second biometric sensor different from the first biometric sensor.

7. The electronic device of claim 6, wherein the extension part of the second PCB includes:
   a second rigid portion, at which the first component is disposed;
   a third rigid portion, at which the third component is disposed;
   a second flexible portion connecting the second rigid portion and the third rigid portion;
   a fourth rigid portion, at which the second component is disposed; and
   a third flexible portion connecting the third rigid portion and the fourth rigid portion,
   wherein the one end of the extension part at least partially includes the second rigid portion, and
   wherein the opposite end of the extension part at least partially includes the fourth rigid portion.

8. The electronic device of claim 6, wherein the first biometric sensor and/or the second biometric sensor is configured to acquire a bioelectrical impedance analysis (BIA) sensor signal and/or an electrocardiogram (ECG) sensor signal, and
   wherein the third component includes an acoustic sensor.

9. The electronic device of claim 1, wherein the second PCB includes a plurality of ground lines,
   wherein the second part includes a conductive area exposed toward the first PCB,
   wherein at least some of the plurality of ground lines are electrically connected to the conductive area, and
   wherein at least some of the plurality of ground lines are electrically connected to the at least one ground part of the first PCB through the conductive area.

10. The electronic device of claim 9, wherein the second part includes a fifth rigid portion, and a fourth flexible portion connecting the fifth rigid portion and the opposite end of the extension part, and
    wherein the conductive area is formed at the fifth rigid portion.

11. The electronic device of claim 10, comprising:
    a C-clip disposed on a first surface of the first PCB or a second surface of the first PCB opposite the first surface, and
    wherein the conductive area is electrically connected to the at least one ground part of the first PCB while contacting the C-clip.

12. The electronic device of claim 1, comprising:
    a wireless communication circuit disposed on the first PCB,
    wherein the housing is electrically connected to the wireless communication circuit at a first point such that electric power is supplied thereto, and wherein the housing is electrically connected to the at least one ground part of the first PCB at a second point.

13. The electronic device of claim 12, wherein the side wall of the housing includes a first part extending from the first point to the second point in a first direction, and a second part extending from the first point to the second point in a second direction that is different from the first direction,
wherein a length of the first part of the side wall is greater than a length of the second part, and
wherein the second PCB is closer to the first part of the side wall than to the second part.

14. The electronic device of claim 1, comprising:
a display, and
wherein the bracket is disposed between the display and the first PCB.

15. A wearable electronic device comprising:
a housing including a side wall at least partially configured as an antenna;
a printed circuit board (PCB) disposed in the housing and including at least one ground part;
a bracket disposed in the housing and supporting the PCB,
a connection member comprising a conductor, wherein the connection member includes:
  an extension part extending along the side wall of the housing;
  a first part extending from one end of the extension part and connected to a part of the printed circuit board different from the at least one ground part; and
  a second part extending from an opposite end of the extension part and electrically connected to the at least one ground part of the PCB;
at least one component disposed on the extension part; and
at least one processor disposed on the PCB, and operatively connected to the at least one component through the connection member,
wherein the connection member includes a plurality of ground lines, and
wherein at least some of the plurality of ground lines are electrically connected to the at least one ground part of the PCB through the second part of the connection member,
wherein the bracket is at least partially spaced apart from the side wall, and
wherein the extension part of the connection member is located between the bracket and the side wall.

16. The wearable electronic device of claim 15, comprising:
a C-clip disposed on the PCB,
wherein the second part includes a conductive area exposed toward the PCB, and
wherein at least some of the plurality of ground lines are electrically connected to the conductive area, and are electrically connected to at least one ground part of the PCB through the C-clip in contact with the conductive area.

17. The wearable electronic device of claim 15, comprising:
a first button and a second button at least partially exposed through the side wall of the housing,
wherein the first button and the second button at least partially overlap the extension part.

18. The wearable electronic device of claim 17, wherein the first button at least partially overlaps the one end of the connection member, and
wherein the second button at least partially overlaps the opposite end of the connection member.

* * * * *